United States Patent [19]
Akiyama et al.

[11] Patent Number: 4,805,025
[45] Date of Patent: Feb. 14, 1989

[54] SIGNAL READ-OUT APPARATUS FOR SOLID-STATE IMAGER

[75] Inventors: Toshiyuki Akiyama, Tokorozawa; Naoki Ozawa, Kokubunji; Takeshi Ogino, Katsuta; Kenji Takahashi, Kanagawa, all of Japan

[73] Assignee: Hitachi, Ltd., Tokyo, Japan

[21] Appl. No.: 13,542

[22] Filed: Feb. 11, 1987

[30] Foreign Application Priority Data

Mar. 14, 1986 [JP] Japan .................................. 61-54721

[51] Int. Cl.$^4$ .............................................. H04N 3/14
[52] U.S. Cl. .......................... 358/213.26; 358/213.27; 358/172
[58] Field of Search ...................... 358/213.26, 213.27, 358/213.11, 171, 172

[56] References Cited
U.S. PATENT DOCUMENTS 4,435,730 3/1984 Bendell et al. ................. 358/213.26
4,698,686 10/1987 Endo et al. ..................... 358/213.26

FOREIGN PATENT DOCUMENTS 5914379 8/1984 Japan .

OTHER PUBLICATIONS

IEEE Journal of Solid-State Circuits, vol. SC-9, No. 1, pp. 1-13, Feb. 1974.

Primary Examiner—Jin F. Ng
Assistant Examiner—Stephen Brinich
Attorney, Agent, or Firm—Antonelli, Terry & Wands

[57] ABSTRACT

A signal read-out apparatus for a solid-state imager employing CCDs (charge-coupled devices) and CPDs (charge priming devices) includes a clamp circuit for eliminating reset noise generated in an amplifier provided at the output of the imager. For eliminating thermal noise of high frequency generated in the amplifier and incapable of being eliminated by the clamp circuit, a low-pass filter is provided in precedence to the clamp circuit. The frequency band of the low-pass filter is not higher than 1.5 times the frequency of a clock pulse signal for driving the solid-state imager. In place of providing the low-pass filter as a discrete component, a low-pass filter having the same characteristics may be constituted by a capacitance of the capacitor and ON-resistance of a switch incorporated in the clamp circuit. The capacitance of the capacitor in the clamp circuit is set to a value greater than the input electrostatic capacity of the amplifier.

38 Claims, 9 Drawing Sheets

SIGNAL READ-OUT APPARATUS FOR SOLID-STATE IMAGER

BACKGROUND OF THE INVENTION

1. FIELD OF THE INVENTION

The present invention relates to a signal read-out apparatus for a solid-state imager in which CCDs (Charge-Coupled Device) or CPDs (Charge Priming Device) are employed.

2. DESCRIPTION OF THE RELATED ART

Figure 1:
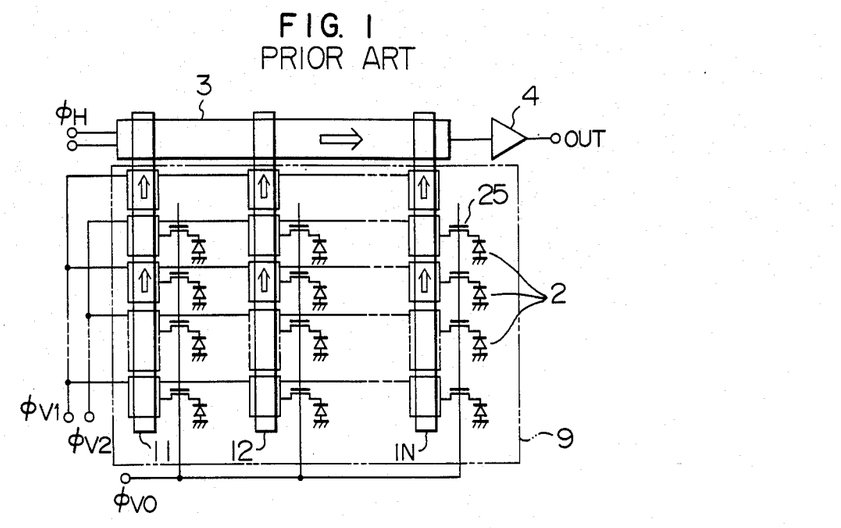
FIG. 1 is a view showing a general arrangement of a CCD solid-state imager.

FIG. 1 of the accompanying drawings is a view for illustrating the principle of a hitherto known CCD solid-state imager which includes a light sensitive portion 9 composed of photodiodes 2 arrayed in a matrix-like configuration, vertical CCDs 11, 12, ..., 1N and a horizontal CCD 3 for reading out light signal charges stored in the photodiodes 2, and an amplifier 4 for amplifying the signal charges transferred thereto for outputting corresponding signals. For particulars, reference may be made to Japanese Patent Application Laid-Open No. 143479/1984 (JP-A-59-143479).

Figure 2:
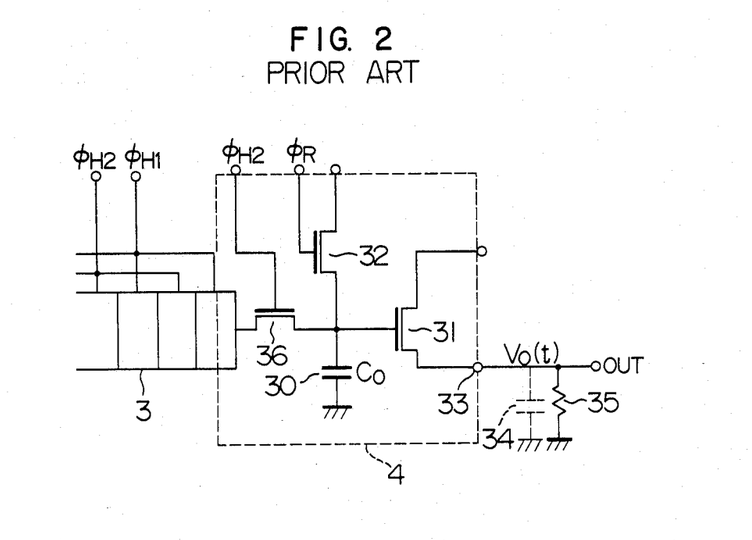
FIG. 2 is a view showing a typical example of the output amplifier (4) of the imager shown in FIG. 1.

FIG. 2 of the accompanying drawings is a view showing a typical circuit arrangement of the output amplifier 4 of the solid-state imager shown in FIG. 1. In FIG. 2, a reference numeral 36 denotes a MOS-type FET which serves to transfer the signal charge $Q_S$ from the horizontal CCD 3 to a capacitor 30 which converts the signal charge $Q_S$ transferred through the horizontal CCD 3 to a corresponding voltage. The capacitor 30 has a small electrostatic capacitance $C_o$. A reference numeral 31 denotes a MOS-type FET serving as a source follower for outputting with a low impedance a signal voltage $V_o$ ($=Q_S/C_o$) which is produced in proportion to the signal charge $Q_S$ transferred to the capacitor 30. A MOS-type FET 32 serves as a resetting MOS-FET for removing externally the signal charge $Q_S$ stored in the capacitor 30. The output signal from the MOS-FET 31 is extracted through an output terminal 33 to be applied to a load resistor 35. A capacitor 34 represents a parasitic capacitance.

Figure 3:
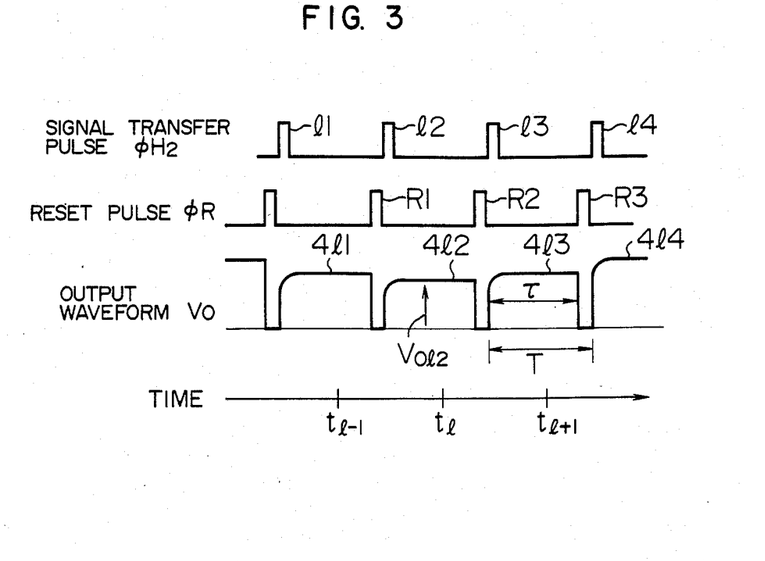
FIG. 3 is a view showing a timing chart for illustrating operation of the output amplifier shown in FIG. 2.

Next, signal read-out operation of the device shown in FIGS. 1 and 2 will be described by referring to FIG. 3. The signal charges stored in the photodiodes 2 during a single frame period are transferred to the vertical CCDs 11, 12, ..., 1N during a vertical retrace period. The vertical CCDs transfer the signal charges corresponding to a horizontal line during each horizontal retrace period sequentially to the horizontal CCD 3. The signal charges sequentially transferred to the horizontal CCD 3 during the horizontal retrace period are sequentially transferred to the capacitor 30 under the timing of a horizontal scanning clock pulse signal $\phi_H$ applied to the horizontal CCD 3 during a succeeding horizontal period. A signal charge $Q_{Sl2}$ transferred to the capacitor 30 in response to the 12-th signal transfer pulse $\phi_{H2}$ causes the capacitor 30 to produce a voltage $V_{ol2}$. Outputted from the ouput of the source-follower MOS-FET 31 is a hold pulse of the voltage $V_{ol2}$ which is of a waveform 412 shown in FIG. 3. Subsequently, the signal charge $Q_{Sl2}$ is removed externally through the resetting MOS-FET 32. Similarly, the next signal charge $Q_{Sl3}$ is transferred to the capacitor 30 in response to the succeeding 13-th signal transfer pulse $\phi_{H2}$, whereby the hold pulse of a voltage $V_{ol3}$ having an output waveform 413 shown in FIG. 3 is outputted. Through repetition of the similar operation, the voltages $V_o$ proportional to the signal charges $Q_S$ can be outputted in the form of the pulse train having an output waveform $V_o$. Modulated signal components of the output waveform $V_o$ shown in FIG. 3 can be extracted through a low-pass filter (LPF).

In connection with the circuit shown in FIG. 2, it should be mentioned that the resetting MOS-FET 32 is not an ideal switch element because it presents resistance in the conducting or ON state. (This resistance will be hereinafter referred to as the ON resistance). Consequently, when the resetting MOS-FET 32 is in the ON state, noise voltage due to thermal noise caused by the ON resistance of the MOS-type FET 32 in the ON state is superposed on the output voltage of the capacitor 30. When the resetting MOS-FET 32 is turned off, the instantaneous value of the abovementioned noise voltage is held to be admixed to the output signal. This phenomenon will be elucidated by referring to FIG. 4 in which a numeral 61 designates a noise voltage produced in the capacitor 30 due to the thermal noise attributable to the thermal noise of the resetting MOS-FET 32 in the ON state thereof, and a numeral 62 designates a noise waveform generated due to the noise voltage held at the instant the resetting MOS-FET 32 is turned off. As will be seen in FIG. 4, the noise voltage appears in both the positive and negative directions with equal probability. The main value of the noise voltage is small and gives rise to substantially no problem at this time point. However, since the noise voltage 62 as held (hereinafter referred to as the reset noise voltage) corresponds to the instantaneous value of the noise voltage designated by 61, the former is superposed on the output waveform and becomes a very significant noise signal.

Figure 5:
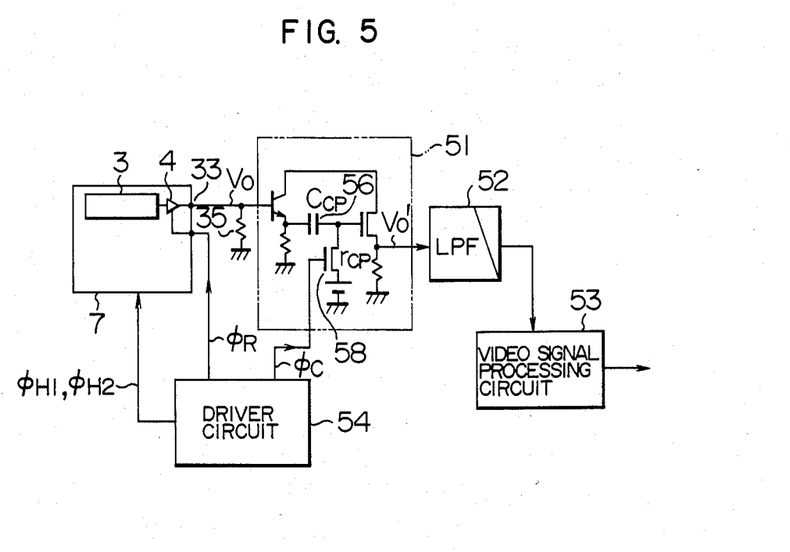
FIG. 5 is a view showing a signal read-out apparatus equipped with a clamp circuit for eliminating the reset noise.

FIG. 5 of the accompanying drawings is a view showing a hitherto known signal read-out apparatus arranged so as to eliminate the reset noise mentioned above. Referring to FIG. 5, a solid-state imager 7 shown therein is similar to the one shown in FIG. 1 in respect to the general arrangement. Accordingly, only the horizontal CCD 3 and the output amplifier 4 are shown in FIG. 5. In this apparatus, elimination of the reset noise is effected by a clamp circuit 51. Concerning this clamp circuit, description may be found in White et al's article entitled "Characterization of Surface Channel CCD Image Arrays at Low Light Levels", IEEE Journal of Solid-State Circuits, Vol. SC-9, No. 1, February 1974.

Figure 6:
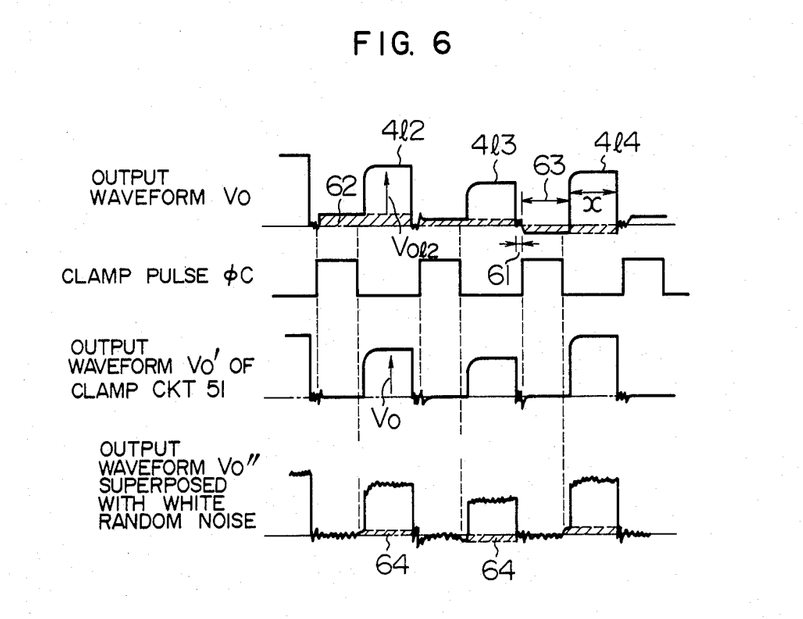
FIG. 6 is a view showing a timing chart for illustrating operation of the apparatus shown in FIG. 5.

Operation of the clamp circuit 51 shown in FIG. 5 will be described by referring to waveform diagrams shown in FIG. 6 of the accompanying drawings. It is to be noted that the output waveform $V_o$ shown in FIG. 6 is the same as the output waveform $V_o$ shown in FIG. 4. The output waveform $V_o$ of the solid-state imager 7 is first supplied to the clamp circuit 51. In response to a clamp pulse $\phi_c$, the clamp circuit 51 clamps the output waveform $V_o$ during a period in which only the reset noise 62 is contained. Thus, an output waveform $V_o'$ from which the reset noise 62 has been eliminated is outputted from the clamp circuit. Modulated signal components of the output waveform $V_o'$ are extracted through a low-pass filter 52. Subsequently, the modulated signal components are processed by a video signal processing circuit 53, whereby a video signal free of the reset noise can be finally obtained as the output signal.

As will be appreciated from the above description, although consideration has heretofore been paid to the influence of the reset noise, no measurements have been heretofore taken for disposing of white random noise produced by the thermal noise source constituted by the MOS-FET 31 shown in FIG. 2. Consequently, the actual output signal of the solid-state imager assumes an output waveform $V_o$ which corresponds to the superposition of the white random noise on the output waveform $V_o'$ shown in FIG. 6.

Such being the circumstances, the clamp circuit 51 shown in FIG. 5 holds the thermal noise voltage of the source follower MOS-FET 31 (as indicated by 64 in FIG. 6), as a result of which the noise level is increased, whereby improvement of S/N ratio remains insignificant.

Figure 7:
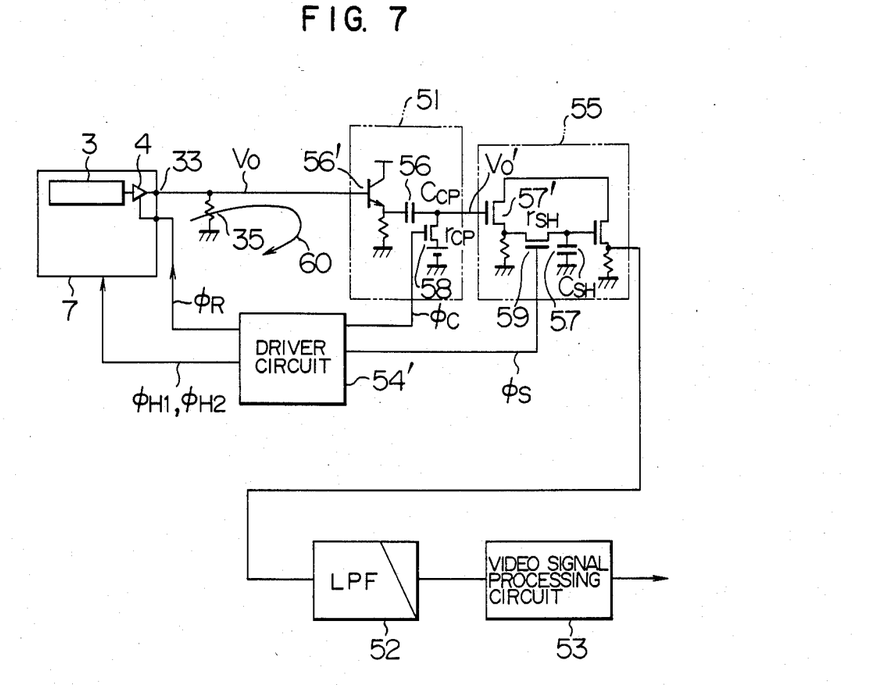
FIG. 7 is a view showing a signal read-out apparatus corresponding to the one shown in FIG. 5 and additionally provided with a sample and hold circuit.

It has been mentioned that the reset noise is eliminated by the clamp circuit 51. However, in many of actual applications, the signal portion is held additionally by a sample and hold circuit 55 before being outputted, as is shown in FIG. 7. (In some cases, a sample circuit is used in place of the sample and hold circuit.) In FIGS. 5 and 7, the time constants which determine the rates at which the signal is charged in capacitances $C_{CP}$ and $C_{SH}$ of the capacitors 56 and 57 in the clamp circuit 51 and the sample and hold circuit 55, respectively, are selected usually to be several nanoseconds which is sufficiently small as compared with the period of the clock pulse driving the solid-state imager, which period is 140 nsec when the frequency of the clock pulse signal is 7.2 MHz. For this reason, the capacities $C_{CP}$ and $C_{SH}$ of the capacitors 56 and 57 in the clamp circuit 51 and the sample and hold circuit 55 are usually dimensioned on the order of about 20 to 30 pF, respectively. However, in the circuit arrangements shown in FIGS. 5 and 7, the clamp circuit 51 and the sample and hold circuit 55 themselves produce noise having relatively high noise level. Thus, the improvement factor of the S/N ratio remains small. It is noted that the noise produced by a transistor 56' and a junction FET 57' among others is at a significantly high level.

SUMMARY OF THE INVENTION

It is an object of the present invention to provide a signal read-out apparatus for a solid-state imager which apparatus is capable of suppressing the increasing of the noise components produced during read-out of the signal from the solid-state imager.

In view of the above object, there is provided according to the present invention a signal read-out apparatus for a solid-state imager which comprises:

a group of photoelectric conversion elements arrayed in a matrix-like configuration for storing signal charges corresponding to light information;

charge transfer means for reading out each of the photoelectric conversion elements to output sequentially the signal charges in the form of successive pulses at an output;

amplifying means for amplifying the signal charges from the abovementioned charge transfer means, the amplifying means including at least a capacitor for sequentially storing the signal charges supplied from the charge transfer means, an amplifier for amplifying signal voltages appearing at the capacitor, and reset means for extracting externally the signal charges stored in the capacitor;

driving means for driving the charge transfer means and the reset means with a clock pulse signal having a frequency of $f_c$;

a low-pass filter having a frequency band which is not higher than 1.5 times of the frequency $f_c$ ($\leq 1.5 f_c$) for receiving the output of the amplifying means; and clamp means for eliminating the reset noise produced by the aforementioned reset means from the output signal after having passed through the above-mentioned low-pass filter.

According to another aspect of the present invention, the aforementioned discrete low-pass filter is replaced by a low-pass filter constituted by the capacitance of a capacitor and ON resistance of a switch (i.e. resistance in the conducting state of the switch) incorporated in the clamp means. According to a further aspect of the invention, the capacitance of the capacitor constituting a part of the clamp means is selected to be 2500 times as large as the electrostatic capacitance at the input of the amplifying means.

According to the teachings of the invention, all variety of noise components produced during the signal read-out operation can be eliminated, whereby a television signal enjoying a high S/N ratio can be obtained to a great advantage.

These and other objects and many of the attendant advantages of the invention will be readily appreciated as the same becomes better understood by reference to the following detailed description when considered in connection with the accompanying drawings.

DESCRIPTION OF THE PREFERRED EMBODIMENTS

Now, the invention will be described first in conjunction with a first exemplary embodiment thereof by referring to the drawings.

Figure 8:
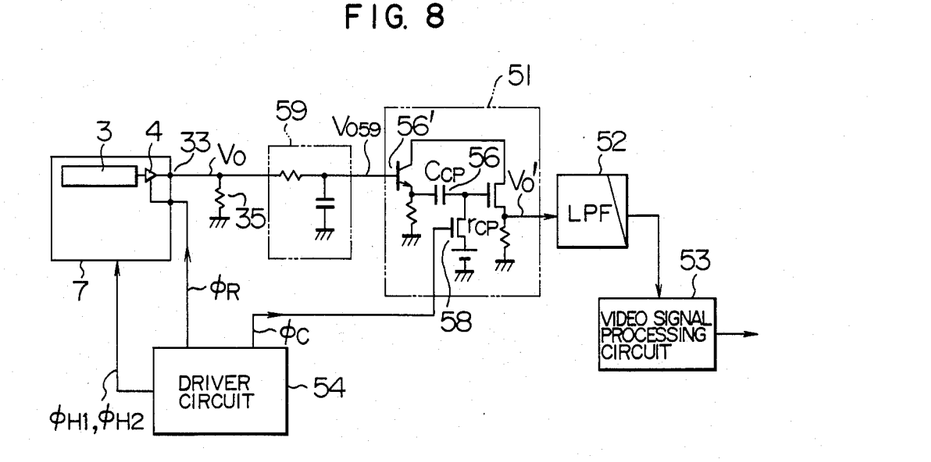
FIG. 8 is a view showing a first embodiment of the present invention.

FIG. 8 shows a signal read-out apparatus according to the first embodiment of the present invention. The circuit arrangement shown in FIG. 8 differs from the one shown in FIG. 5 in that a low-pass filter 59 is provided as a preceding stage to the clamp circuit 51. The pass band of the low-pass filter is set at about 6 MHz (not higher than 7.16 MHz×1.5). The output signal $V_o$ of the solid-state imager 7 having passed through the low-pass filter 59 results in a signal $V_{o59}$ from which high frequency components of thermal noise have been eliminated. The clamp circuit 51 performs non-linear operation on this signal $V_{o59}$. However, since this signal $V_{o59}$ no longer contains any noise components superposed thereon, increase in the noise level cannot take place, unlike that of the hitherto known apparatus.

A driver circuit 54 produces signal transfer pulses $\phi_{H1}$, $\phi_{H2}$ for the horizontal CCD 3, a reset pulse $\phi_R$ and a clamp pulse $\phi_C$. Each of these clock pulse signals has a frequency of 7.16 MHz. Accordingly, the period T of the reset pulse $\phi_R$ is about 140 nsec. The width $\tau_r$ of the reset pulse $\phi_R$ (refer to FIG. 4) is set to a duration of about 20 nsec which is sufficiently long for removing the signal charge $Q_S$ stored in the capacitor 30 shown in FIG. 2. On the other hand, the position at which the signal transfer pulse $\phi_{H2}$ rises up is set with a delay of about 60 nsec relative to the falling position of the reset pulse $\phi_R$, whereby the period (T-$\tau_r$-$\tau$) including only the reset noise is set substantially equal to a period $\tau$ covering the signal.

It should be mentioned that a sample and hold circuit or a sample circuit may be inserted in succession to the clamp circuit 51.

Figure 9:
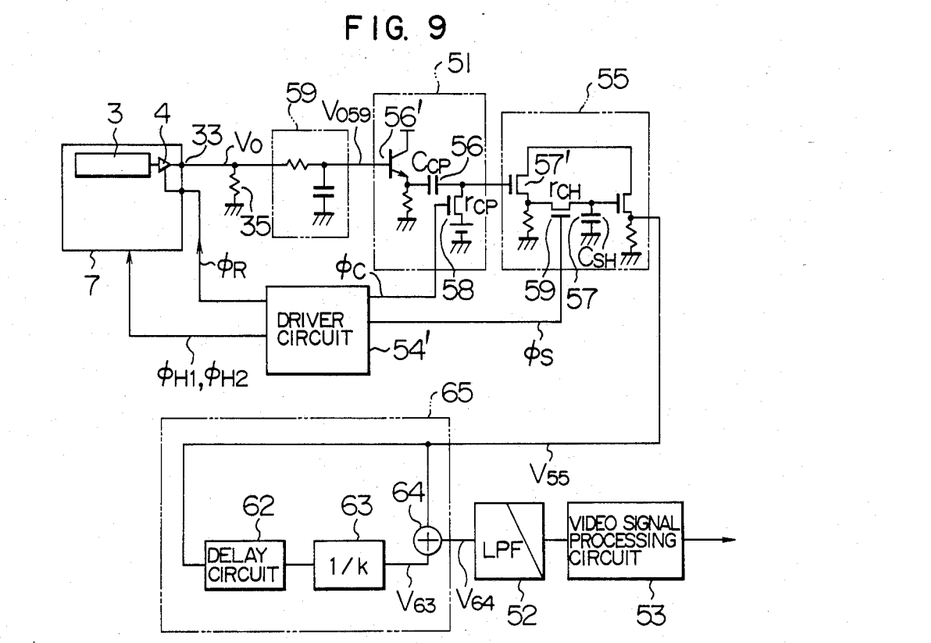
FIG. 9 is a view showing a modification of the embodiment shown in FIG. 8.

FIG. 9 shows a modification of the first embodiment of the present invention. The signal read-out apparatus shown in FIG. 9 differs from the one shown in FIG. 8 in that a sample and hold circuit 55 and means 65 for solving the problem attendant on the provision of the low-pass filter 59 are provided at stages subsequent to the clamp circuit 51. The means 65 is constituted by a delay circuit 62, an attenuator circuit 63 and an adder circuit 64. In the apparatus shown in FIG. 9, the sample and hold circuit 55 is inserted for the purpose of eliminating disturbance of the signal waveform occurring at the time when the clamp pulse is applied. This sample and hold circuit 55 may be spared as in the case of the apparatus shown in FIG. 8.

Figure 10:
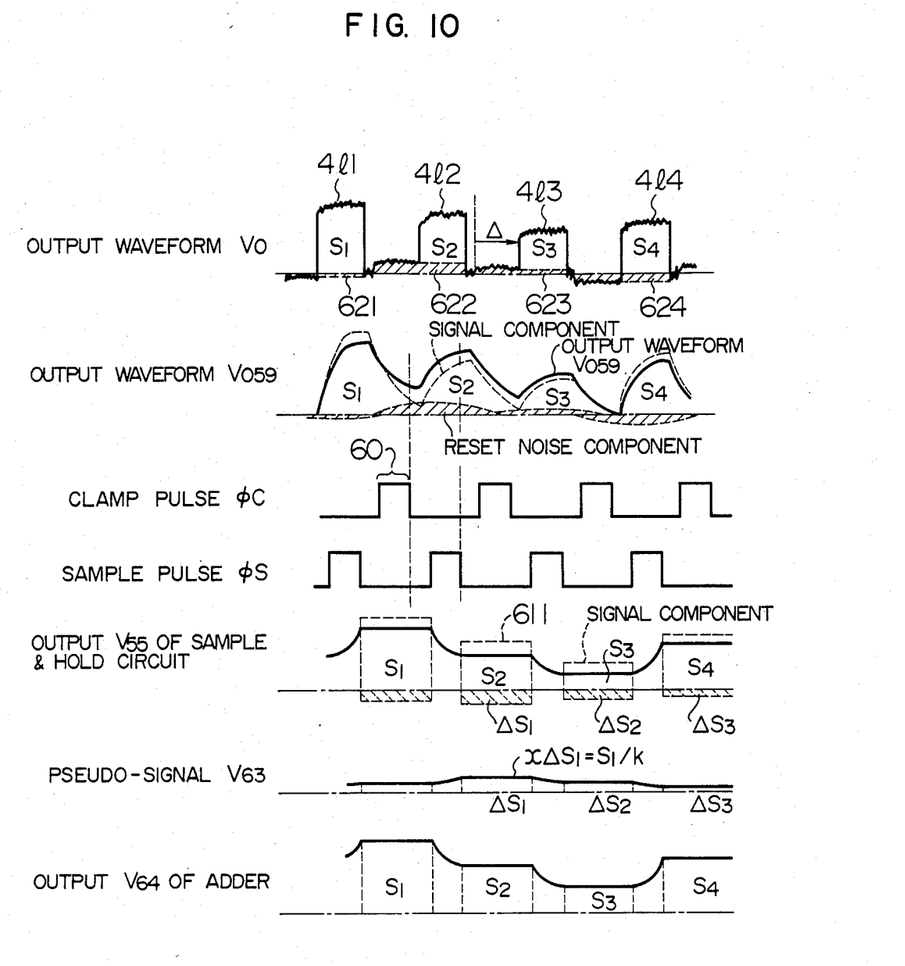
FIG. 10 is a view showing a timing chart for illustrating operations of the embodiments shown in FIGS. 8 and 9.

Description will be made below concerning the problem associated with the provision of the low-pass filter circuit 59 by referring to FIG. 10. In general, when the frequency band of the output signal $V_o$ of the solid-state imager 7 is simply limited by using the low-pass filter 59 (particularly limited not higher than 1.5 times of the clock pulse frequency $f_c$=7.16 MHz), the output waveform $V_o$ shown in FIG. 10 assumes a spreaded waveform such as $V_{o59}$ shown in the same figure. By way of example, the signal component $S_1$ (411) contained in the output wave form $V_o$ is spreaded up to the succeeding clamp region 60 and thus clamped together with the reset noise 622. As a consequence, in the held signal $V_{55}$ having passed through the sample and hold circuit 55, the signal period 611 primarily consisting of the signal $S_2$, for example, contains as mixed subtractively therein a signal component $\Delta S_1$ corresponding to the signal $S_1$ preceding by one clock pulse period and multiplied by 1/k (i.e. $\Delta S_1 = S_1/k$), where k>0, preferably k≧4. The admixed signal component $\Delta S_n$ in the form of color mixture in a single plate color camera which includes a plurality of color filters disposed checkerwise on the solid-state imager shown in FIG. 1. Thus, when the television signal is extracted directly from the output of the sample and hold circuit 55, the image quality undergoes undesirable deterioration. To deal with this problem, the embodiment shown in FIG. 9 includes the means 65 for eliminating the color mixture. This means 65 will hereinafter be referred to as the color mixture eliminating circuit.

Now, operation of the color mixture eliminating circuit 65 will be explained by referring to FIG. 10. As described above, the output signal $V_{55}$ of the sample and hold circuit 55 contains as mixed subtractively the signal component $\Delta S_1$ (=$S_1$/k) corresponding to the signal preceding by one clock pulse period and multiplied with 1/k. The output $V_{55}$ of the sample and hold circuit 55 is inputted to the delay circuit 62 the output of which is delayed by one clock pulse and applied to the attenuator circuit 62. The latter produces a pseudo-signal $V_{63}$ corresponding to the output signal of the delay circuit 62 and attenuated by a factor of 1/k. The pseudo-signal $V_{63}$ is applied to the adder circuit 64 which then adds together the output signal $V_{55}$ of the sample and hold circuit 55 and the pseudo-signal $V_{63}$. In this manner, an output signal $V_{64}$ from which the color mixture signal $\Delta S_n$ has been eliminated can be obtained. It should be mentioned that the order in which the delay circuit 62 and the attenuator circuit 63 are connected in the color mixture eliminating circuit 65 shown in FIG. 9 may be reversed without affecting the operation of the circuit 65. Further, it should be appreciated that although the sample and hold circuit is employed, this circuit may be omitted or replaced by a sample circuit.

Next, a second embodiment of the present invention will be described hereinafter.

In the case of the apparatus shown in FIGS. 8 and 9, the circuit configuration is complicated and difficulty will arise in implementing it in the form of IC because the low-pass filter 59 is provided at the stage preceding to the clamp circuit 51. Besides, the low-pass filter 59 itself tends to produce noise. This noise undergoes influence of the non-linear operation of the clamp circuit 51 and the sample and hold circuit 55 as in the case of the thermal noise of the source follower MOS-FET 31, whereby the noise level is increased to be subsequently admixed to the signal of the sample and hold circuit. Thus, the noise reduction efficiency of the circuits shown in FIGS. 8 and 9 remain unsatisfactory.

According to the second embodiment of the invention, the frequency band of the transfer characteristics of the circuit system including the output amplifier 4 and the load 35 thereof is widened sufficiently, wherein the output signal is directly inputted to the clamp circuit 51 without undergoing band-limitation by the low-pass filter 59. Further, the frequency band of a circuitry composed of the capacitance $C_{CP}$ of the capacitor 56 constituting a part of the clamp circuit 51 and the ON-resistance $r_{CP}$ of the switch element 58 is set substantially equal to the band required for the low-pass filter 59 shown in FIGS. 8 and 9. Similarly, the frequency band determined by the capacitance $C_{SH}$ of the capacitor 57 constituting a part of the sample and hold circuit 55 and the ON-resistance of the switch 59 is set substantially equal to the band required for the low-pass filter 59 shown in FIGS. 8 and 9. In this manner, noise reduction can also be accomplished by imparting the function of the low-pass filter 59 to the clamp circuit 51 and the sample and hold circuit themselves.

Now, the second embodiment of the invention will be described by referring to FIG. 7. In the figure, the driver circuit 54' produces clock pulse signals $\phi_{H1}$ and $\phi_{H2}$ and a reset pulse signal $\phi_R$ for driving the solid-state imager 7 as well as a clamp pulse signal $\phi_C$ and a sample pulse signal $\phi_S$, respectively. The frequency $f_c$ of these pulse signals $\phi_{H1}$, $\phi_{H2}$, $\phi_R$, $\phi_C$ and $\phi_S$, respectively, is 7.16 MHz. Accordingly, the period T of the reset pulse signal $\phi_R$ is $1/f_c \approx 140$ nsec. The width or duration $\tau_r$ of the reset pulse $\phi_R$ (see FIG. 4) is set to about 20 nsec which is sufficiently long enough to remove the signal charge $Q_S$ stored in the capacitor 30 shown in FIG. 2. The rise-up position of the signal transfer pulse $\phi_{H2}$ is set at a position delayed about 60 nsec relative to the falling position of the reset pulse $\phi_R$ so that the period $(T-\tau_r-\tau)$ containing only the reset noise is approximately equal to the signal period $\tau$ (see FIG. 4).

With the driving system described above, the output waveform $V''_o$ corresponding to the output signal waveform $V_o$ of the solid-state imager 7 superposed with the random noise (refer to FIG. 6) is supplied directly to the clamp circuit 51, wherein the signal portion of the level 62 corresponding to the reset noise is stored in the capacitor 56 in the form of electric charge to be thereby clamped.

When the signal is stored at the reset noise level, the switch element 58 is turned on. At that time, the ON-resistance $r_{CP}$ and the capacity $C_{CP}$ function as a low-pass filter to the signal applied across the capacity $C_{CP}$. The frequency band $f_{CP}$ of the low-pass filter is given approximately by $$f_{CP} \approx \frac{1}{2\pi r_{CP} \times C_{CP}}$$

Thus, the frequency band $f_o$ of the circuitry 60 composed of the output amplifier 4 of the solid-state imager 7 and the load 35 is set at a sufficiently higher frequency than the frequency band $f_L \approx 1.3 \times f_c$ required for the low-pass filter 59 shown in FIGS. 8 and 9. By way of example, the frequency band $f_o$ may be set about twice to four times as high as the clock pulse frequency $f_c$ (e.g. 25 MHz). Additionally, the frequency band of the clamp circuit 51 is adjusted approximately equal to $f_L$ (i.e. $f_{CP} \approx f_L$). However, the pulse width of the clamp pulse is a period including only the reset noise and is set as wide as possible, e.g. at 50 nsec. In this manner, the frequency band of the signal applied across the capacitance $C_{CP}$ can be limited to the band $f_L$ without additionally providing the circuit with the low-pass filter 59. Further, the clamp circuit 51 set as described above can limit not only the band of the output signal of the solid-state imager but also the noise produced by the transistor 56' of the clamp circuit 51, whereby increase of noise can be effectively suppressed.

Similarly, the sample and hold circuit 55 for sampling and holding the signal level has also a frequency band $f_{SH}$ determined approximately by the ON-resistance $r_{SH}$ of the switch element 59 and the capacity $C_{SH}$ thereof, as given by $$f_{SH} \approx \frac{1}{2\pi \cdot r_{SH} \times C_{SH}}$$

By setting the frequency $f_{SH}$ at a value substantially equal to the frequency $f_L$ (i.e. $f_{SH} \approx f_L$), not only the noise contained in the signal sampled and held but the noise produced by the junction FET 57' can be limited so as to be substantially equal to the frequency $f_L$, whereby the noise can be prevented from increasing.

In this case, the color mixture eliminating circuit 65 shown in FIG. 9 may be provided at a location preceding the low-pass filter 52 to thereby exclude the color mixture.

In the foregoing description, it has been assumed that the output signal of the solid-state imager 7 has a sufficiently wide frequency band $f_o$. However, the frequency band $f_o$ of the circuitry 60 in actuality has a finite value. Accordingly, the conditions for the frequency band of the output signal of the clamp circuit 51 or that of the sample and hold circuit 55 can be essentially determined by the bands $f_{CP}$ and $f_{SH}$ thereof, respectively and are more specifically summarized as follows:

$$f_o \gtrsim f_{CP} \text{ or } f_{SH} \gtrsim f_L$$

More precisely, the frequency band of the signal applied across the capacitance $C_{CP}$ of the clamp circuit and clamped has a frequency characteristic determined by the product of the frequency characteristic determined by the frequency band $f_o$ and the frequency characteristic determined by the band $f_{CP}$ and is slightly narrower than the band $f_{CP}$. Thus, unless the band $f_o$ is substantially wider than the band $f_L$, the frequency band $f_{CP}$ should be so set as to be slightly wider than the band $f_L$ in consideration of the fact that the band of the signal clamped as mentioned above becomes narrow. In that case, the frequency band $f_{SH}$ of the sample and hold circuit is similarly required to be set slightly wider than the band $f_L$.

Figure 11:
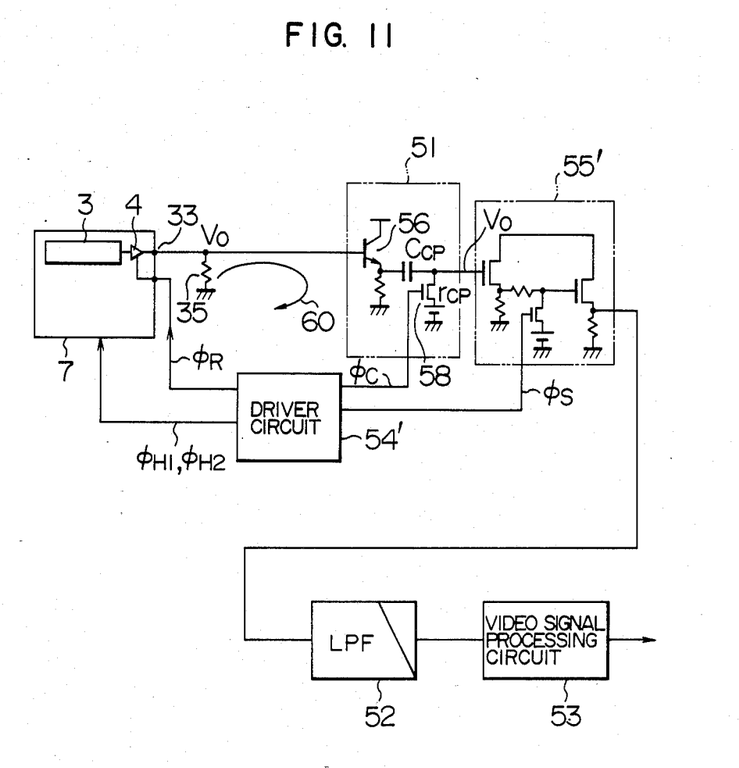
FIG. 11 is a view showing another exemplary embodiment of the sample and hold circuit shown in FIG. 7.

It should be mentioned that the sample and hold circuit shown in FIG. 7 may be replaced by a sample circuit 55', as is shown in FIG. 11, or alternatively may be spared to substantially same effect.

Figure 12:
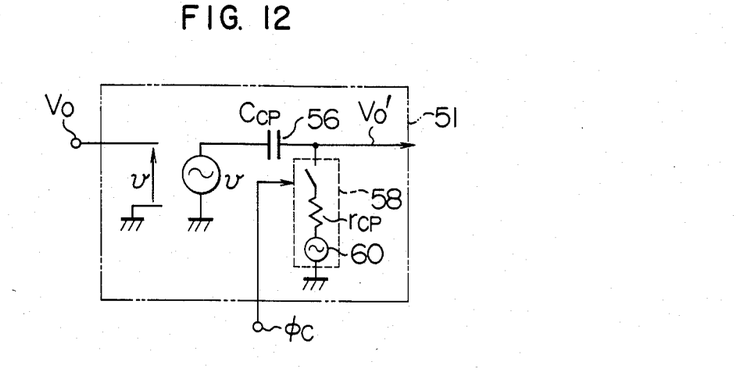
FIG. 12 is a view showing an equivalent circuit of the clamp circuit (51)

Next, a third embodiment of the present invention will be described by referring to FIG. 7. In the circuit arrangement shown in FIG. 7, noise generation of the clamp circuit 51 can be explained as follows. The clamp circuit 51 can be represented by an equivalent circuit composed of the switch element 58 which has the capacitance $C_{CP}$ and the ON-resistance $r_{CP}$, as is shown in FIG. 12. Since the ON-resistance $r_{CP}$ of the switch element 58 provides a thermal noise source as with the case of common resistors, the instantaneous value of noise is held in the capacitance $C_{CP}$ every time the switch 58 is turned off and on for performing the clamping operation. The instantaneous noise value thus held is added to the signal voltage $V_o$ transmitted during the OFF-state of the switch 58, giving rise to the generation of noise.

In conjunction with this, it is noted that the reset noise is generated when the ON-resistance thermal noise of the resetting MOS-FET 32 is held in the capacitance $C_o$ of the capacitor 30, wherein the amplitude of the noise voltage is given by $$\sqrt{V_{no}^2} = \sqrt{\frac{k \cdot T}{C_o}}$$

Since the noise generation in the clamp circuit 51 is ascribable to the similar phenomenon and can be determined by the value of the capacitance $C_{CP}$, the amplitude of the noise voltage held in the capacitance $C_{CP}$ can be expressed as follows:

$$\sqrt{|V_{n,CP}|^2} = \sqrt{\frac{k \cdot T}{C_{CP}}}$$

Thus, the ratio of the reset noise level to that of the clamp circuit is approximately given by $1/\sqrt{C_o} : 1/\sqrt{C_{CP}}$. However, since the reset noise is reduced by about 20 dB (1/10) due to the operation of the clamp circuit 51, the ratio of the noise levels of the signal after having passed through the clamp circuit is approximately given by $1/\sqrt{100 \times C_o} : 1/\sqrt{C_{CP}}$. In order to allow the noise of the clamp circuit 51 to be negligible, the level of the clamp noise may have to be lower than about 1/5 of the reset noise after noise reduction. Accordingly, the capacitance $C_{CP}$ is required to satisfy the condition given by the following expression:

$$\frac{1}{\sqrt{100 \times C_o}} \times \frac{1}{5} \geqq \frac{1}{\sqrt{C_{CP}}}$$

In other words, the capacitance $C_{CP}$ may be selected to be greater than the signal detecting capacitance $C_o$ of the solid-stage imager 7 by a factor of about 2500 or more (i.e. $C_{CP} \gtrsim C_o \times 2500$).

By way of example, assuming that the solid-state imager 7 having the signal detecting capacitance of about 20 fF ($20 \times 10^{-15}$F), the capacitance $C_{CP}$ of the clamp circuit 51 may be set equal to or greater than about 50 pF. In this connection, it should be recalled that the pulse width of the clamp pulse is set to about 50 nsec. Thus, by setting the capacitance $C_{CP}$ of the clamp circuit 51 at the value mentioned above, the noise of the clamp circuit 51 becomes negligible relative to the reset noise after noise reduction. This means that the reset noise reduction capability or performance of the circuit arrangement shown in FIGS. 5 or 7 can be brought out satisfactorily, whereby the signal of high S/N ratio can be obtained.

Figure 13:
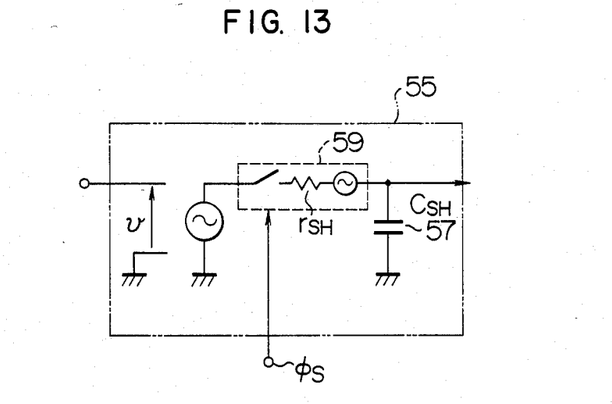
FIG. 13 is a view showing an equivalent circuit of the sample and hold circuit (55)

The sample and hold circuit 55 shown in FIG. 7 can be represented by an equivalent circuit shown in FIG. 13. This equivalent circuit is composed of the capacitance $C_{SH}$ of the capacitor 57 and the switch 59 having the ON-resistance $r_{SH}$, as in the case of the clamp circuit 51. The noise level of the circuit 55 is given by $$\sqrt{|V_{n,SH}|^2} = \sqrt{\frac{k \cdot T}{C_{SH}}}$$

As will be seen, the same conditions as that for the capacitance $C_{CP}$ of the clamp circuit 51 are valid for the capacitance $C_{SH}$ of the capacitor 57. Thus, the capacitance $C_{SH}$ may also be selected to be greater than the signal detecting capacity $C_o$ by a factor of about 2500 or more (i.e. $C_{SH} \gtrsim C_o \times 2500$). In this case, the capacitance $C_{SH}$ may be about 50 pF or more.

In case the sample and hold circuit is replaced by a sample circuit or is alternatively omitted, only the clamp circuit is dimensioned as described above without affecting the intended results.

Figure 4:
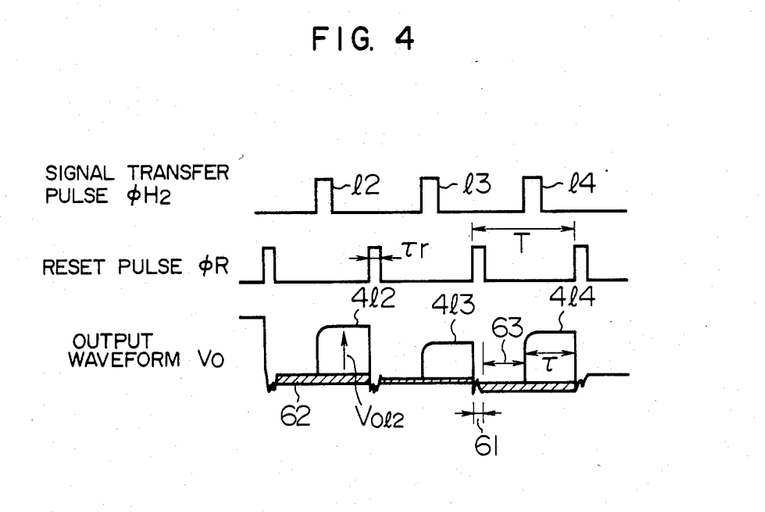
FIG. 4 is a view showing a timing chart for illustrating reset noise outputted from the output amplifier (4) shown in FIG. 2.
Figure 14:
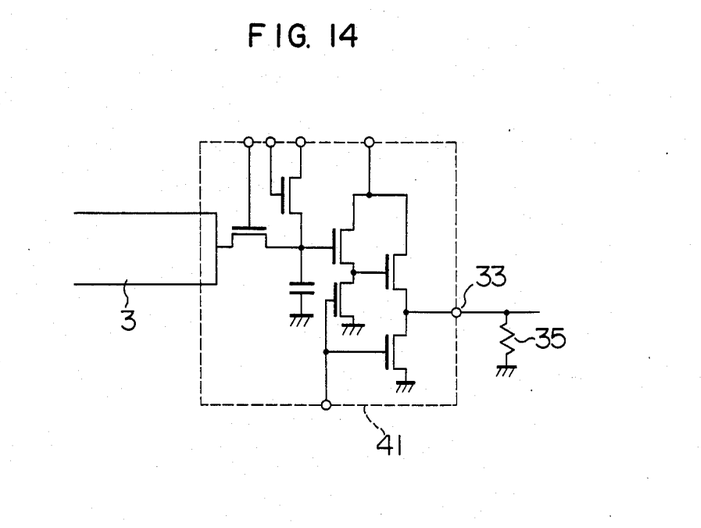
FIGS. 14 and 15 are views showing, respectively, further embodiments of the output amplifier (4).
Figure 15:
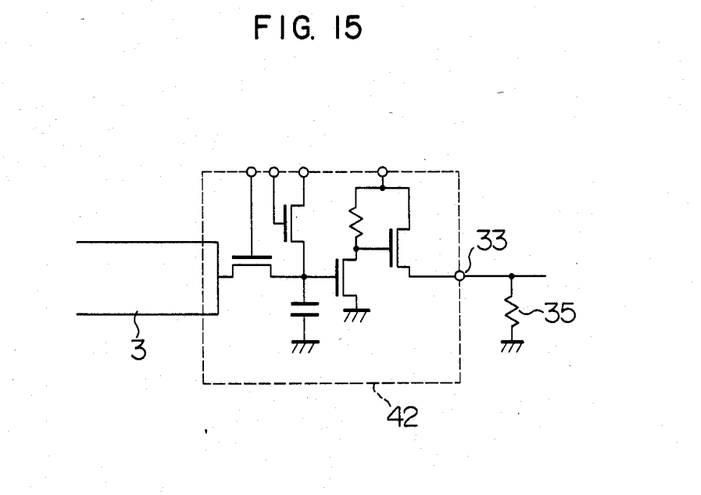

In the foregoing, the first, second and third embodiments of the invention have been described in conjunction with the output amplifier 4 shown in FIG. 4. It should however be appreciated that the invention can be equally applied to output amplifiers 41 and 42 shown in FIGS. 14 and 15, respectively. In general, the invention can be applied to the signal read-out apparatus for the CCD solid-state imager incorporating an output amplifier for amplifying a signal voltage appearing across the input capacitance $C_o$ of the amplifier to a power or voltage, a solid-state imager apparatus of the combined MOS and CCD type such as the one disclosed in U.S. Pat. No. 4,316,205, a CCD-type line sensor, a CCD-type delay line or the like.

Although the invention has been described in connection with the first, second and third exemplary embodiments which are assumed to be independent of one another, it goes without saying that the signal read-out apparatus of low noise can be realized also by combining appropriately these embodiments.

We claim:

1. A signal read-out apparatus for a solid-state imager, comprising:
   a group of photoelectric conversion elements arrayed in a matrix-like configuration for storing signal charges corresponding to light information;
   charge transfer means for reading out each of the photoelectric conversion elements to output sequentially the signal charges in the form of successive pulses at an output;
   amplifying means for amplifying the signal charges from said charge transfer means and providing a representative output signal, said amplifying means including at least a capacitor for sequentially storing the signal charges supplied from the charge transfer means, an amplifier for amplifying signal voltages appearing at the capacitor, and reset means for extracting externally the signal charges stored in the capacitor;
   driving means for driving the charge transfer means and the reset means with a clock pulse signal having a predetermined frequency of $f_c$;
   a low-pass filter having a frequency band which is less than or equal to 1.5 times said predetermined frequency $f_c$ for receiving the output of the amplifying means; and
   clamp means, coupled to said low-pass filter, for eliminating the reset noise produced by said reset means from the output signal after having passed through said low-pass filter.

2. A signal read-out apparatus according to claim 1, wherein said clamp means has an output for providing an output signal, and further comprising branching means for branching in parallel the output signal from said clamp means;
   delay and attenuation means for displaying one of said branched signals for one period of said clock -pulse signal and attenuating said one branched signal to a predetermined value of said output signal; and
   addition means for adding together the other branched signal and the signal from said delay and attenuating means.

3. A signal read-out apparatus according to claim 2, wherein said delay and attenuation means delaying one of said branched signals for one period of said clock pulse frequency $f_c$ and attenuating said one branched signal to a predetermined value proportionately corresponding to 1/k times said clamp means output signal, where $K > 0$.

4. A signal read-out apparatus according to claim 3, wherein said delay and attenuation means includes a series arrangement of a delay circuit followed by an attenuation circuit.

5. A signal read-out apparatus according to claim 3, wherein said delay and attenuation means includes a series arrangement of an attenuation circuit followed by a delay circuit.

6. A signal read-out apparatus according to claim 1, further including a sampling means for sampling the output signal from said clamp means or, alternatively, sample and hold means for sampling and holding said output signal to be subsequently outputted.

7. A signal read-out apparatus according to claim 6, further comprising branching means for branching in parallel an output signal from said sample means or, alternatively, from said sample hold means;
delay and attenuation means for delaying one of said branched signals for one period of said clock pulse signal and attenuating said one branched signal to a predetermined value of said output signal; and
addition means for adding together the other branched signal and the signal from said delay and attenuation means.

8. A signal read-out apparatus according to claim 7, wherein said delay and attenuation means delaying one of said branched signals for one period of said clock pulse frequency fc and attenuating said one branched signal to a predetermined value proportionately corresponding to 1/k times the output signal of said sample means or, alternatively, said sample and hold means, where K>0.

9. A signal read-out apparatus according to claim 8, wherein said delay and attenuation means includes a series arrangement of a delay circuit followed by an attenuation circuit.

10. A signal read-out apparatus according to claim 8, wherein said delay and attenuation means includes a series arrangement of an attenuation circuit followed by a delay circuit.

11. A signal read-out apparatus for a solid-state imager, comprising:
a group of photoelectric conversion elements arrayed in a matrix-like configuration for storing signal charges corresponding to light information;
charge transfer means for reading out each of the photoelectric conversion elements to output sequentially the signal charges in the form of successive pulses at an output;
amplifying means for amplifying the signal charges from said charge transfer means, the amplifying means including at least a capacitor for sequentially storing the signal charges supplied from the charge transfer means, an amplifier for amplifying signal voltages appearing at the capacitor and providing a representative output signal across a load thereof, and reset means for extracting externally the signal charges stored in the capacitor;
driving means for driving the charge transfer means and the reset means with a clock pulse signal having a predetermined frequency of $f_c$; and
clamp means for eliminating reset noise generated in said reset means from the output signal of said amplifying means;
wherein said clamp means includes a first capacitor and a first switch, a low-pass filter constituted by the capacitance ($C_{CP}$) of said first capacitor and ON-resistance ($r_{CP}$) of said first switch, said low-pass filter having a frequency band $f_{CP}$ defined by $$f_{cp} = \frac{1}{2\pi \times r_{cp} \times C_{cp}};$$

said amplifying means and said load constituting a circuit having a frequency band $f_o$ which is sufficiently greater than said frequency band $f_{CP}$ and a transfer characteristic given by a product of the transfer characteristic of said frequency band $f_o$ and the transfer characteristic of said frequency band $f_{CP}$ having a frequency band not higher than 2 times the frequency $f_c$ of said clock pulse.

12. A signal read-out apparatus according to claim 11, further comprising sample and hold means for holding the output signal from said clamp means which is to be subsequently outputted, said sample and hold means having a second capacitor and a second switch, wherein a frequency band $f_{SH}$ determined by the capacitance $C_{SH}$ of said second capacitor and ON-resistance $r_{SH}$ of said second switch is given by $$[f_{SH} = \tfrac{1}{2}\pi \cdot r_{SH} \cdot C_{SH}] f_{SH} = \frac{1}{2\pi \times r_{SH} \times C_{SH}};$$

said amplifying means and said load thereof constituting a circuit having a frequency band $f_o$ which is sufficiently greater than said frequency band $f_{SH}$, and a transfer characteristic given by a product of the transfer characteristic of said frequency band $f_o$ and the transfer characteristic of said frequency band $f_{SH}$ having a frequency band not higher than 2 times the frequency $f_c$ of said clock pulse.

13. A signal read-out apparatus according to claim 11, wherein said amplifying means capacitor includes at least an input electrostatic capacitance $C_o$ and wherein the capacitance $C_{CP}$ of said first capacitor is greater than said input electrostatic capacitance $C_o$ by a factor of 2500 or more.

14. A signal read-out apparatus according to claim 12, wherein said amplifying means capacitor includes at least an input electrostatic capacitance $C_o$ and wherein the capacitance $C_{SH}$ of said second capacitor is greater than said input electrostatic capacitance $C_o$ by a factor of 2500 or more.

15. A signal read-out apparatus according to claim 11, wherein said amplifying means comprises a MOSFET coupled as a source follower, a gate to ground coupled capacitor having an electrostatic capacitance $C_o$; a resetting MOSFET coupled with daid capacitor at a junction and being in series therewith, said junction being coupled to a MOSFET transfer switch for sequentially transferring respective signal charges from said imager to said capacitor via a horizontal scanning phase clock signal.

16. A signal read-out apparatus according to claim 15, wherein said driving means provides respective out-of-phase clock signals for operating said MOSFET transfer switch and said resetting MOSFET, the duty cycle of said clock signal for operating said resetting MOSFET being less than that for operating said MOSFET transfer switch and wherein the frequency of both is the same and is equal to $f_c$.

17. A signal read-out apparatus according to claim 16, wherein said clamp means has an input coupled to the source of said source follower and includes the series combination of a base-emitter junction of an emitter follower, said first capacitor and a MOSFET switching resistor, said MOSFET switching resistor being responsive to a clamp pulse clock phase signal generated by said driving means and having a frequency $f_c$.

18. A signal read-out apparatus according to claim 17, further comprising sample and hold means for holding the ouput signal from said clamp means which is to be subsequently outputted, said sample and hold means having a second capacitor and a second switch, wherein a frequency band $f_{SH}$ determined by the capacitance $C_{SH}$ of said second capacitor and ON-resistance $r_{SH}$ of said second switch is given by $$f_{SH} = \frac{1}{2\pi \times r_{SH} \times C_{SH}} ;$$

said amplifying means and said load thereof constituting a circuit having a frequency band $f_o$ which is sufficiently greater than said frequency band $f_{SH}$, and a transfer characteristic given by a product of the transfer characteristic of said frequency band $f_o$ and the transfer characteristic of said frequency band $f_{SH}$ having a frequency band not higher than 2 times the frequency $f_c$ of said clock pulse.

19. A signal read-out apparatus according to claim 18, wherein said second capacitor and said second switch are series connected and wherein said clamp means provides an output signal at the junction of said first capacitor and said MOSFET switching resistor, said second capacitor being coupled between said clamp means junction and a further output via respective source follower connected MOSFETs.

20. A signal read-out apparatus for a solid-state imager, comprising:
a group of photoelectric conversion elements arrayed in a matrix-like configuration for storing signal charges corresponding to light information;
charge transfer means for reading out each of the photoelectric conversion elements to output sequentially the signal charges in the form of successive pulses at an output;
amplifying means for amplifying the signal charges from said charge transfer means and providing a representative output signal, the amplifying means including at least a capacitor having an input electrostatic capacitance $C_o$ for sequentially storing the signal charges supplied from the charge transfer means, an amplifier for amplifying signal voltage appearing at said capacitor, and reset means for extracting externally the signal charges stored in said capacitor;
driving means for driving the charge transfer means and the reset means with a clock pulse signal having a predetermined frequency of $f_c$; and
clamp means for eliminatng reset noise generated in said reset means from the output signal of said amplifying means;
wherein said clamp means has a first capacitor whose capacitance $C_{CP}$ is greater than said input electrostatic capacitance $C_o$ by a factor of 2500 or more.

21. A signal read-out apparatus according to claim 20, further comprising sample and hold means for holding the output signal from said clamp means, said sample and hold means including a second capacitor whose capacitance $C_{SH}$ is greater than said input electrostatic capacitance $C_o$ of said amplifying means.

22. A signal read-out apparatus for a solid-state imager, comprising:

a group of photoelectric conversion elements arrayed in a matrix-like configuration for storing signal charges corresponding to light information;
charge transfer means for reading out each of the photoelectric conversion elements to output sequentially the signal charges in the form of successive pulses at an output;
amplifying means for amplifying the signal charges from said charge transfer means and providing a representative output signal, said amplifying means including at least a capacitor for sequentially storing the signal charges supplied from the charge transfer means, an amplifier for amplifying signal voltages appearing at said capacitor, and reset means for extracting externally the signal charges stored in said capacitor;
driving means for driving the charge transfer means and the reset means with a clock pulse signal having a predetermined frequency of $f_c$;
clamp means for eliminating from said output signal the reset noise produced by said reset means, said clamp means having an output; and
a low-pass filter inserted between said amplifying means and said clamp means and having a frequency band which is less than or equal to 1.5 times said predetermined frequency $f_c$.

23. A signal read-out apparatus according to claim 22, further including a sampling means for sampling an output signal from said clamp means output or, alternatively, sample and hold means for sampling and holding said output signal to be subsequently outputted.

24. A signal read-out apparatus according to claim 22, wherein said solid-state imager comprises an array of vertical CCD registers and a horizontal CCD register clocked by a horizontal scanning clock pulse signal.

25. A signal read-out apparatus according to claim 22, wherein said amplifying means comprises a MOSFET coupled as a source follower, a gate to ground coupled capacitor having an electrostatic capacitance $C_o$, a resetting MOSFET coupled with said capacitor at a junction and being in series therewith, said junction being coupled to a MOSFET transfer switch for sequentially transferring respective signal charges from said imager to said capacitor via a horizontal scanning phase clock signal.

26. A signal read-out apparatus according to claim 25, wherein said driving means provides respective out-of-phase clock signals for operating said MOSFET transfer switch and said resetting MOSFET, the duty cycle of said clock signal for operating said resetting MOSFET being less than that for operating said MOSFET transfer switch and wherein the frequency of both is the same and is equal to $f_c$.

27. A signal read-out apparatus according to claim 26, wherein said clamp means has an input coupled to the source of said source follower and includes the series combination of a base-emitter junction of an emitter follower, a further capacitor and a MOSFET switching resistor, said MOSFET switching resistor being responsive to a clamp pulse clock phase signal generated by said driving means and having a frequency $f_c$.

28. A signal read-out apparatus according to claim 27, further comprising a MOSFET type sampling means having an input for sampling the output signal provided by said clamp means at the junction of said further capacitor and said MOSFET switching resistor and an output from providing an output signal.

29. A signal read-out apparatus according to claim 28, further comprising branching means for branching in parallel the output signal from said sampling means;

delay and attenuation means for delaying one of said branched signals for one period of said clock pulse frequency $f_c$ and attenuating said one branched signal to a predetermined value proportionately corresponding to 1/k times said sampling means output signal, where K>0; and summing means for summing the other branched signal and the signal from said delay and attenuation means.

30. A signal read-out apparatus according to claim 29, wherein the factor 1/k corresponds to values of k≧4.

31. A signal read-out apparatus according to claim 30, wherein said delay and attenuation means includes a series arrangement of a delay circuit followed by an attenuation circuit.

32. A signal read-out apparatus according to claim 31, wherein said MOSFET type sampling means comprises a sampling and hold circuit.

33. A signal read-out apparatus according to claim 30, wherein said delay and attenuation means includes a series arrangement of an attenuation circuit followed by a delay circuit.

34. A signal read-out apparatus according to claim 33, wherein said MOSFET type sampling means comprises a sampling and hold circuit.

35. A signal read-out apparatus according to claim 27, further comprising branching means for branching in parallel the output signal from said clamp means at the junction of said further capacitor and said MOSFET switching resistor;

delay and attenuation means for delaying one of said branched signals for one period of said clock pulse frequency $f_c$ and attenuating said one branched signal to a predetermined value proportionately corresponding to 1/k times said clamp means output signal, where K>0; and summing means for summing the other branched signal and the signal fromm said delay and attenuation means.

36. A signal read-out apparatus according to claim 35, wherein the factor 1/k corresponds to values of k≧4.

37. A signal read-out apparatus according to claim 36, wherein said delay and attenuation means includes a series arrangement of a delay circuit followed by an attenuation circuit.

38. A signal read-out apparatus according to claim 36, wherein said delay and attenuation means includes a series arrangement of an attenuation circuit followed by a delay circuit.

* * * * *